United States Patent
Na et al.

(10) Patent No.: US 9,240,458 B2
(45) Date of Patent: Jan. 19, 2016

(54) METHODS OF FABRICATING NONVOLATILE MEMORY DEVICES AND RELATED DEVICES

(71) Applicant: Samsung Electronics Co., Ltd., Suwon-si (KR)

(72) Inventors: Hyun-Seok Na, Hwaseong-si (KR); Ji-Hwon Lee, Suwon-si (KR); Joong-Shik Shin, Yongin-si (KR); Chang-Sun Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 371 days.

(21) Appl. No.: 13/742,554

(22) Filed: Jan. 16, 2013

(65) Prior Publication Data

US 2013/0183818 A1 Jul. 18, 2013

(30) Foreign Application Priority Data

Jan. 17, 2012 (KR) ........................ 10-2012-0005324

(51) Int. Cl.
*H01L 21/764* (2006.01)
*H01L 29/66* (2006.01)
*H01L 21/28* (2006.01)
*H01L 21/762* (2006.01)
*H01L 27/115* (2006.01)

(52) U.S. Cl.
CPC .... *H01L 29/66477* (2013.01); *H01L 21/28273* (2013.01); *H01L 21/764* (2013.01); *H01L 21/76224* (2013.01); *H01L 21/76229* (2013.01); *H01L 27/1157* (2013.01); *H01L 27/11519* (2013.01); *H01L 27/11524* (2013.01); *H01L 27/11565* (2013.01)

(58) Field of Classification Search
CPC ..................... H01L 29/66477; H01L 27/1157; H01L 21/764; H01L 21/76229; H01L 21/76224; H01L 21/28273
See application file for complete search history.

(56) References Cited

U.S. PATENT DOCUMENTS

| | | | |
|---|---|---|---|
| 7,915,138 B2 * | 3/2011 | Cho et al. | 438/435 |
| 8,962,444 B2 * | 2/2015 | Kim et al. | 438/424 |
| 9,035,419 B2 * | 5/2015 | Oh et al. | 257/522 |
| 2010/0230741 A1 | 9/2010 | Choi et al. | |
| 2010/0248471 A1 | 9/2010 | Nam et al. | |

FOREIGN PATENT DOCUMENTS

| | | |
|---|---|---|
| KR | 1020030083174 A | 10/2003 |
| KR | 1020090105437 A | 10/2009 |

* cited by examiner

*Primary Examiner* — Savitr Mulpuri
(74) *Attorney, Agent, or Firm* — Myers Bigel Sibley & Sajovec, P.A.

(57) ABSTRACT

Provided is a fabricating method of a nonvolatile memory. The fabricating method includes forming a plurality of gates extending in a first direction on a substrate to be adjacent to each other, forming a gap-fill layer filling at least a portion of a space between the plurality of gates, forming a supporter pattern supporting the plurality of gates on the plurality of gates and the gap-fill layer, and forming an air gap in the space between the plurality of gates by removing the gap-fill layer.

18 Claims, 18 Drawing Sheets

METHODS OF FABRICATING NONVOLATILE MEMORY DEVICES AND RELATED DEVICES

CROSS-REFERENCE TO RELATED APPLICATION

This application claims priority under 35 U.S.C. §119 from Korean Patent Application No. 10-2012-0005324 filed on Jan. 17, 2012 in the Korean Intellectual Property Office, the entire contents of which are incorporated by reference herein.

BACKGROUND

The present invention relates to methods for fabricating nonvolatile memory devices.

Semiconductor memory devices are largely classified into volatile memory devices and nonvolatile memory devices. Volatile memory devices refer to memory devices that lose stored data when they are disconnected from their power sources. Examples of volatile memory devices include static random access memory (SRAM) devices, dynamic random access memory (DRAM) devices and synchronous dynamic random access memory (SDRAM) devices. In contrast, nonvolatile memory devices refer to memory devices that retain stored data even when the devices are disconnected from their power sources. Examples of nonvolatile memory devices include read only memory (ROM) devices, programmable read only memory (PROM) devices, electrically programmable read only memory (EPROM) devices, electrically erasable programmable read only memory (EEPROM) devices, flash memory devices, nonvolatile memory devices that use a resistive elements (for example, phase-change random access memory (PRAM) devices, ferroelectric random access memory (FRAM) devices or resistive random access memory (RRAM) devices) and so on.

In a flash memory device, a plurality of adjacent gate lines that extend in first direction may be formed on a substrate. As the integration level of flash memory devices is increased, the width of these gate lines and/or the distance between adjacent gate lines may be decreased. As the gate lines become thinner and closer together, the possibility that one or more gate lines may collapse or lean onto an adjacent gate line (which is referred to herein as a "gate leaning phenomenon") during the manufacture of the flash memory may be increased.

SUMMARY

The present invention provides methods of fabricating nonvolatile memory devices which can reduce the rate of occurrence of the above-mentioned gate leaning phenomenon.

According to an aspect of the present invention, there is provided a method of fabricating a nonvolatile memory device in which a plurality of gates that extend in a first direction are formed on a substrate to be adjacent to each other. A gap-fill layer is formed that fills at least a portion of spaces that are provided between the plurality of gates. A supporter pattern that supports the plurality of gates is formed on the plurality of gates and the gap-fill layer. Finally, an air gap is formed in spaces between the plurality of gates by removing the gap-fill layer.

According to another aspect of the present invention, there is provided a method of fabricating a nonvolatile memory device in which a plurality of gates are formed that extend on a substrate in a first direction, where each of the gates includes a lower structure, a metal gate pattern and a mask pattern, which are sequentially stacked. A gap-fill layer is formed in spaces between the plurality of gates, the gap-fill layer completely covering sidewalls of the lower structure and the metal gate pattern. A supporter layer is formed on the plurality of gates and the gap-fill layer. A photoresist pattern that includes one or more line patterns is formed to extend on the supporter layer in a second direction that is different from the first direction. A supporter pattern is formed by using the photoresist pattern to pattern the supporter layer. Finally, air gaps are formed in the spaces between the plurality of gates by removing the gap-fill layer.

BRIEF DESCRIPTION OF THE DRAWINGS

The above and other features and advantages of the present invention will become more apparent by describing in detail example embodiments thereof with reference to the attached drawings in which.

DETAILED DESCRIPTION OF THE EMBODIMENTS

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numbers indicate like components throughout the specification. In the attached figures, the thickness of various layers, regions and the like may be exaggerated for clarity.

It will be understood that when an element or layer is referred to as being "connected to," or "coupled to" another element or layer, it can be directly connected to or coupled to another element or layer, or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The use of the terms "a" and "an" and "the" herein, in the context of describing the invention (especially in the context of the following claims), are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified.

Figure 1:
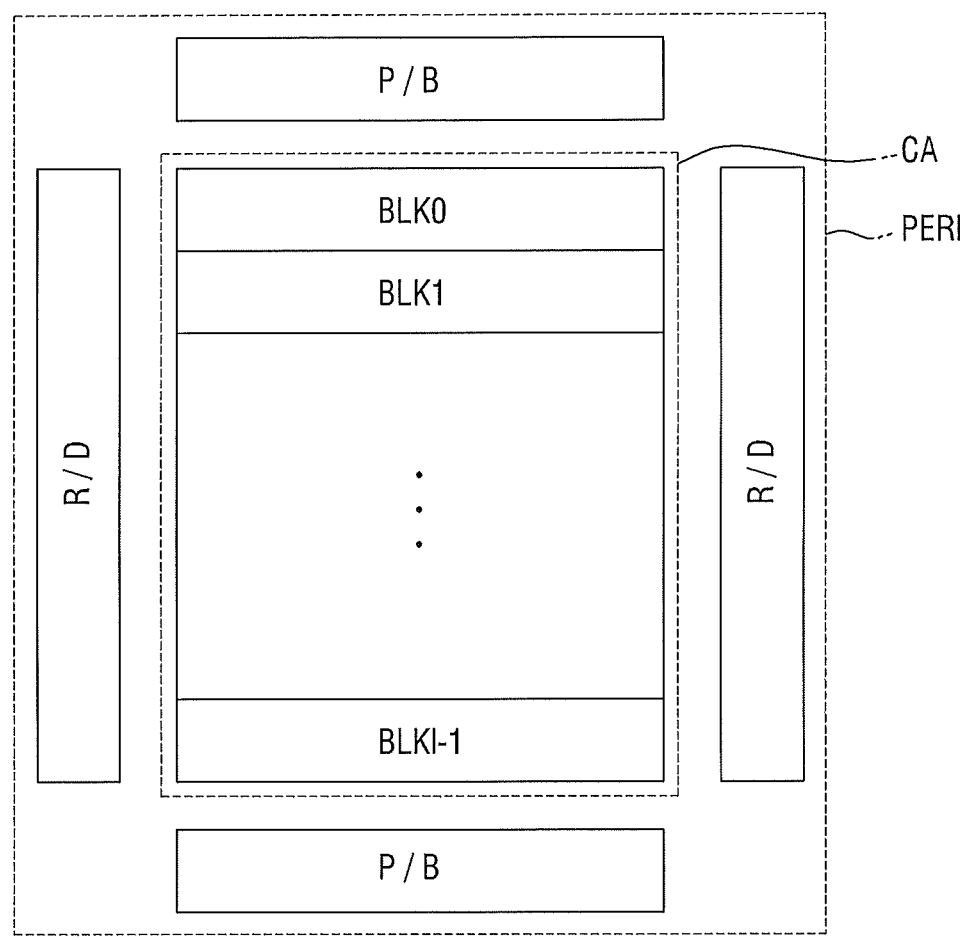
FIG. 1 is a block diagram illustrating a nonvolatile memory device according to some embodiments of the present invention.
Figure 2:
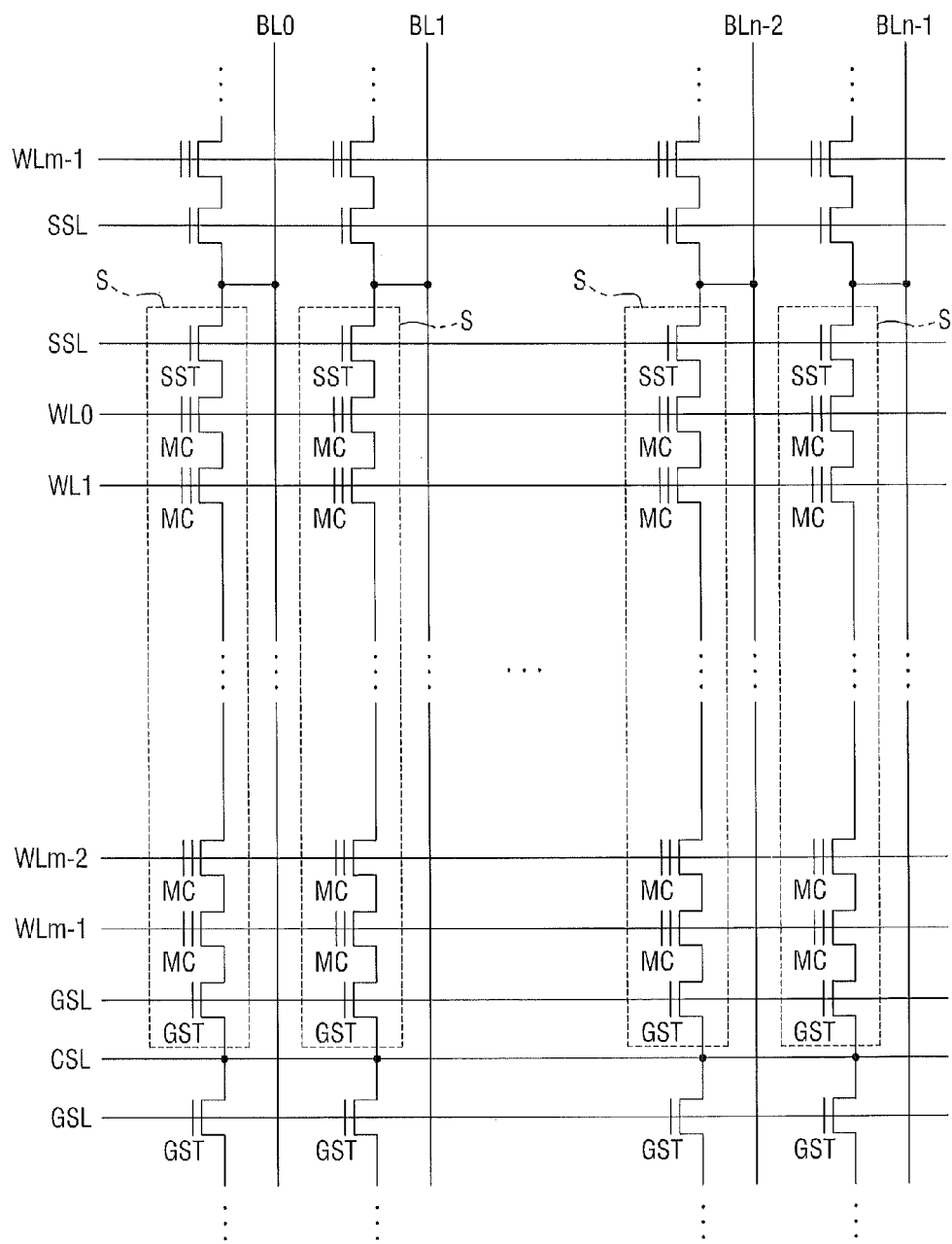
FIG. 2 is a circuit diagram of a portion of the cell array region of the nonvolatile memory device shown in FIG. 1.

FIG. 1 is a block diagram illustrating a nonvolatile memory device according to some embodiments of the present invention. FIG. 2 is a circuit diagram of a portion of the cell array region of the nonvolatile memory device shown in FIG. 1. In FIGS. 1 and 2, the nonvolatile memory device is described with regard to a NAND flash memory by way of example, but aspects of the present invention are not limited thereto.

As shown in FIGS. 1 and 2, the nonvolatile memory device includes a plurality of cell blocks BLK0~BLK1-1 that are arranged in a cell array region (CA). A string select line (SSL), a ground select line (GSL) and a common source line (CSL) may be provided for each of the cell blocks BLK0~BLK1-1 (see FIG. 2). A plurality of word lines WL0~WLm-1 are arranged between the string select line (SSL) and the ground select line (GSL). In addition, a plurality of bit lines BL0~BLn-1 are arranged to intersect the plurality of word lines WL0-WLm-1. A memory cell transistor MC may be defined at each of intersections of the bit lines BL0~BLn-1 and the word lines WL0~WLm-1, and a string select transistor (SST) and a ground select transistor (GST) may be defined at the intersections of the string select line (SSL) and the bit lines BL0~BLn-1 and at the intersections of the ground select line (GSL) and the bit lines BL0~BLn-1, respectively. The string select transistor (SST), the plurality of memory cell transistors (MC) and the ground select transistor (GST) are connected in series to form a string (S). The strings in each bit line (BL) formed for the respective cell blocks BLK0~BLK1-1 are connected to each other in parallel. That is to say, a drain of the string select transistor (SST) of each string (S) is connected to the bit line (BL), and a source of the ground select transistor (GST) is connected to the common source line (CSL).

Page buffers (P/B) may be arranged at top and bottom sides of a peripheral circuit area (PERI) and row decoders (RID) are arranged at the left and right sides of the peripheral circuit area (PERI).

Hereinafter, methods of fabricating nonvolatile memory devices according to embodiments of the present invention will be described with reference to FIGS. 3 to 15.

Figure 3:
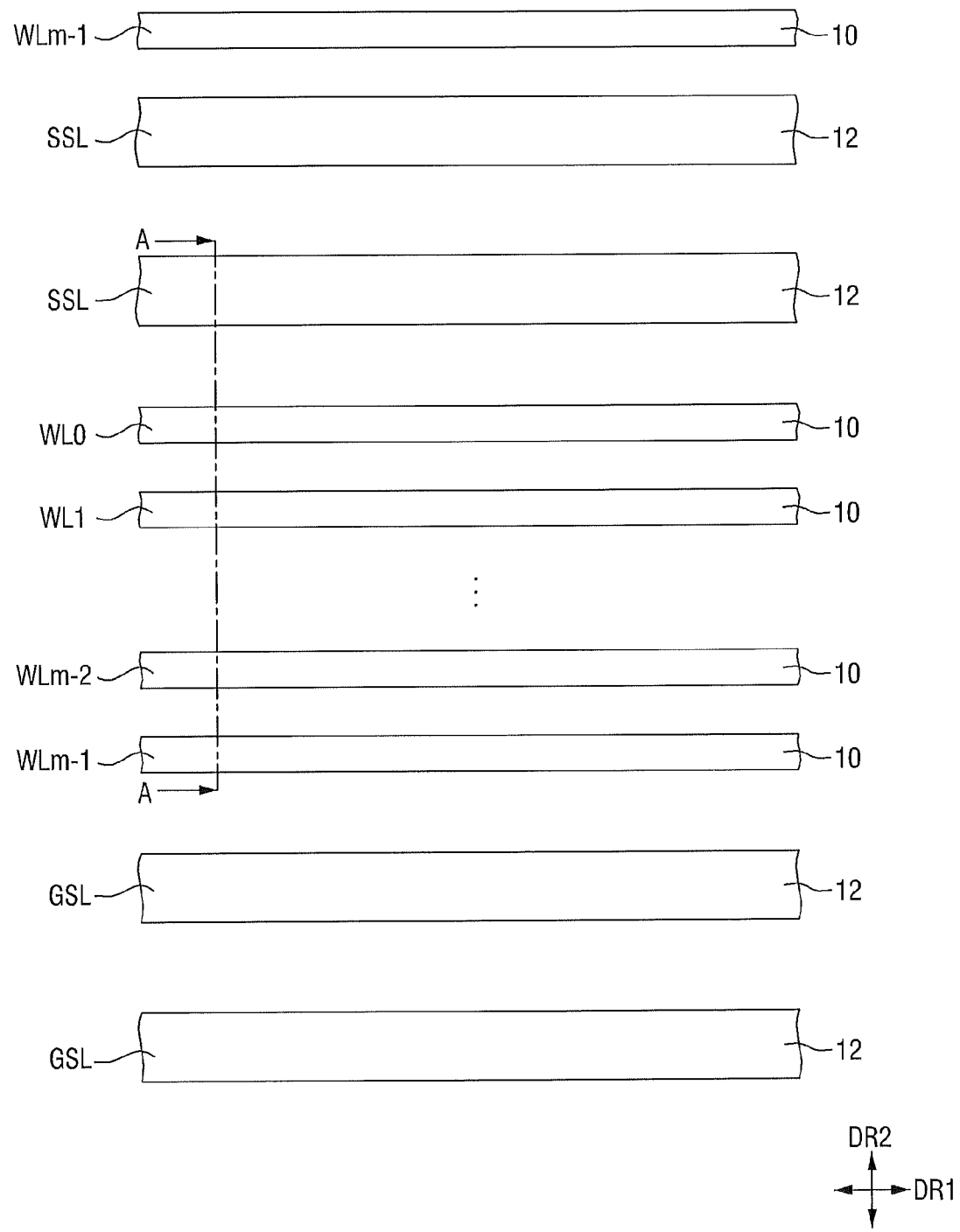
FIGS. 3 to 15 are diagrams illustrating intermediate steps of methods of fabricating a nonvolatile memory device according to embodiments of the present invention.
Figure 9:
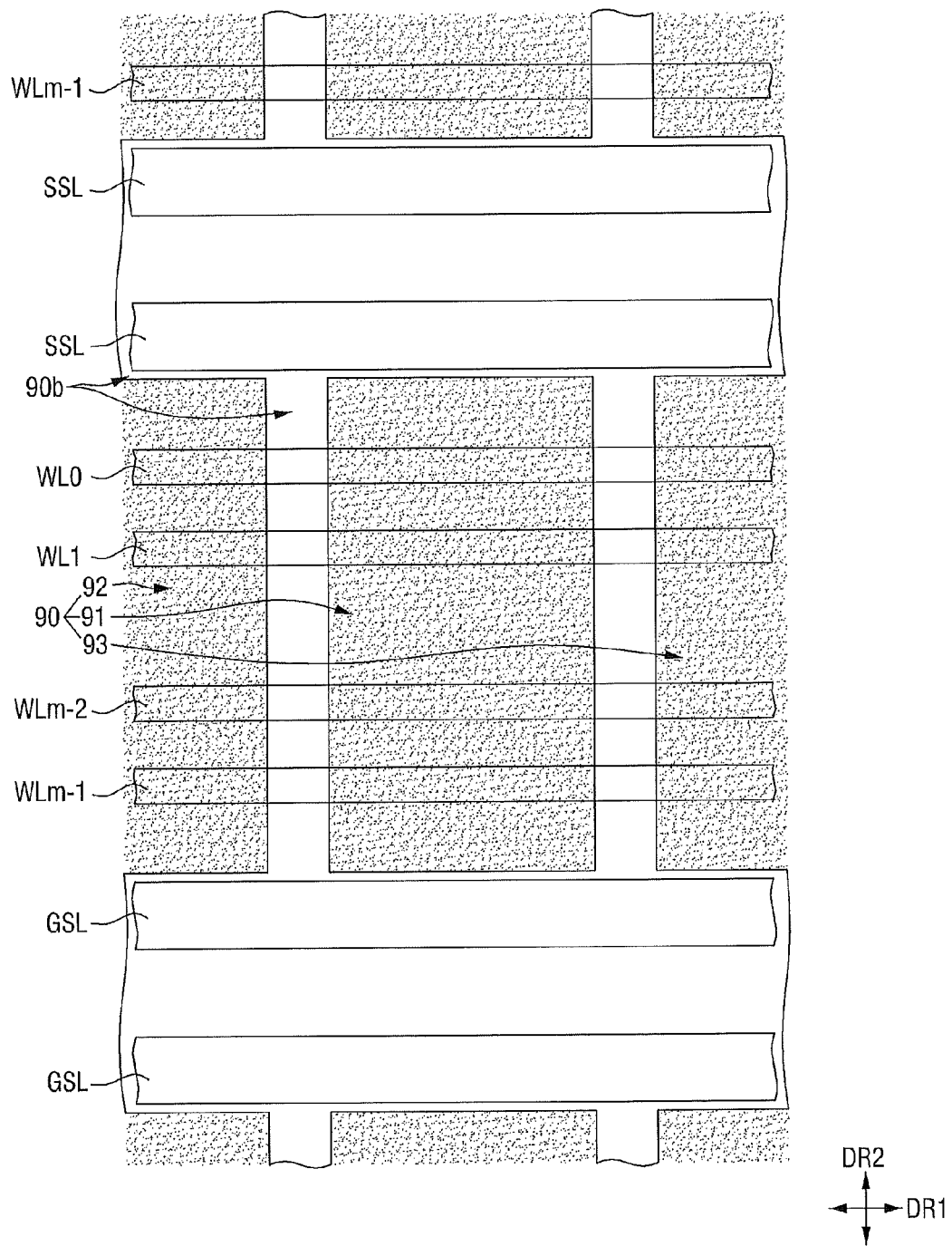
Figure 10:
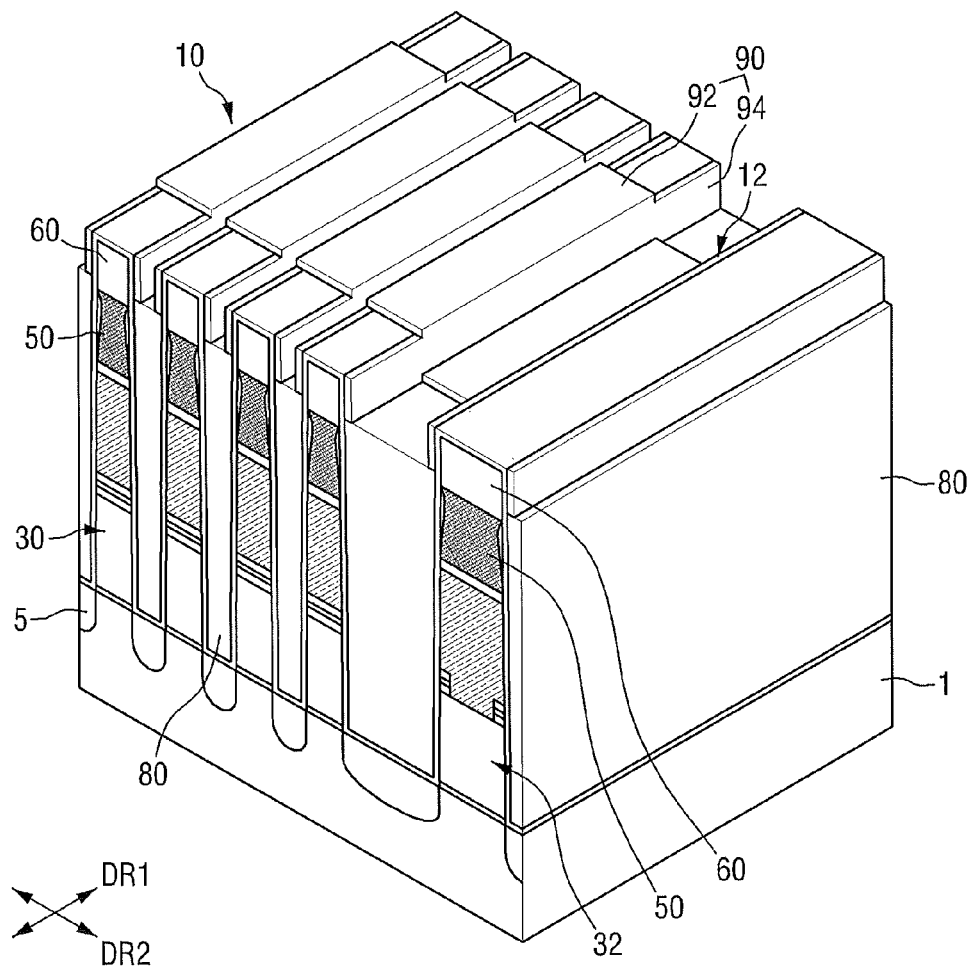
Figure 11:
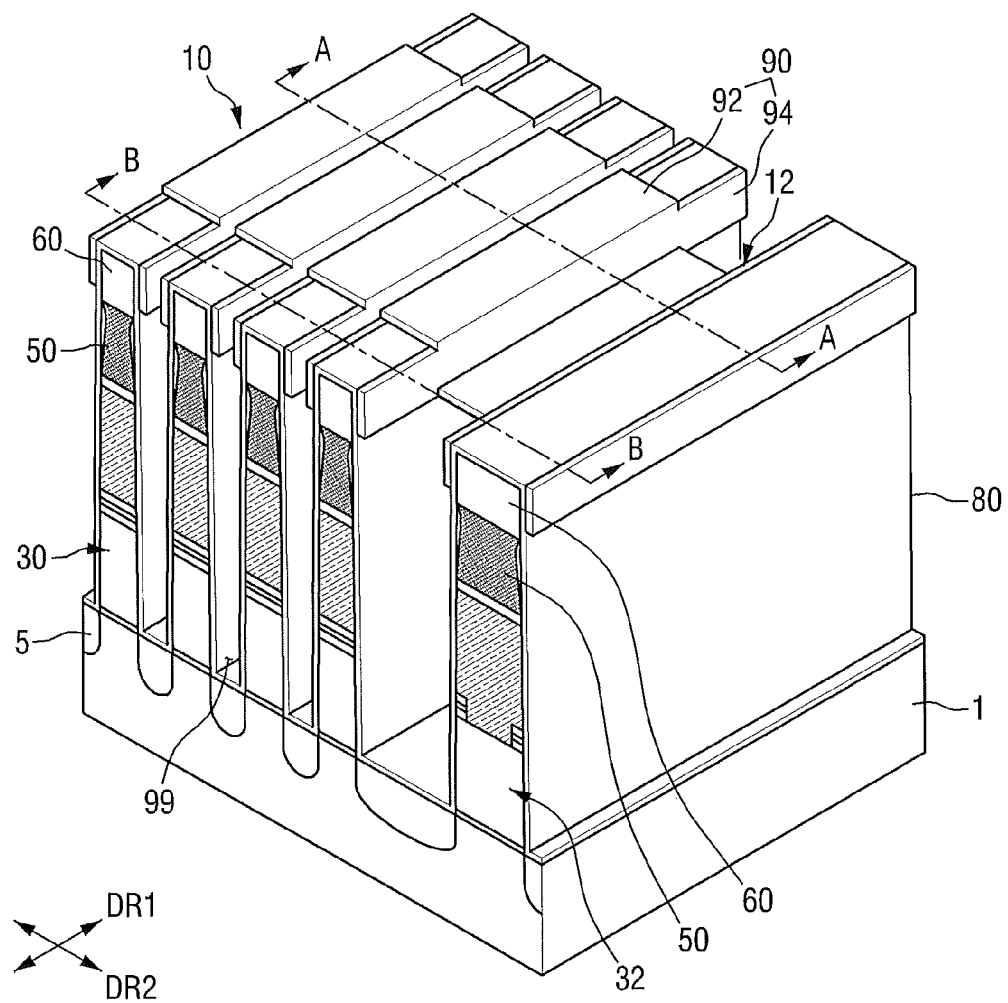
Figure 12:
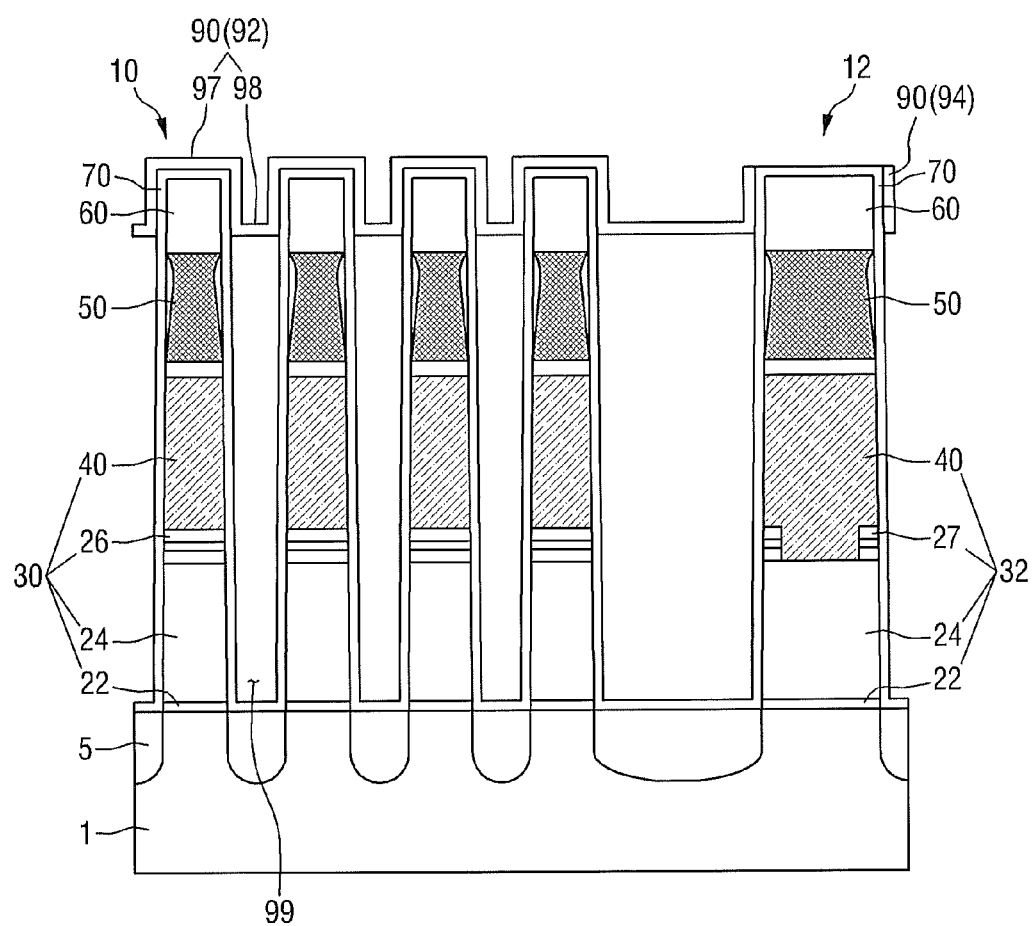
Figure 13:
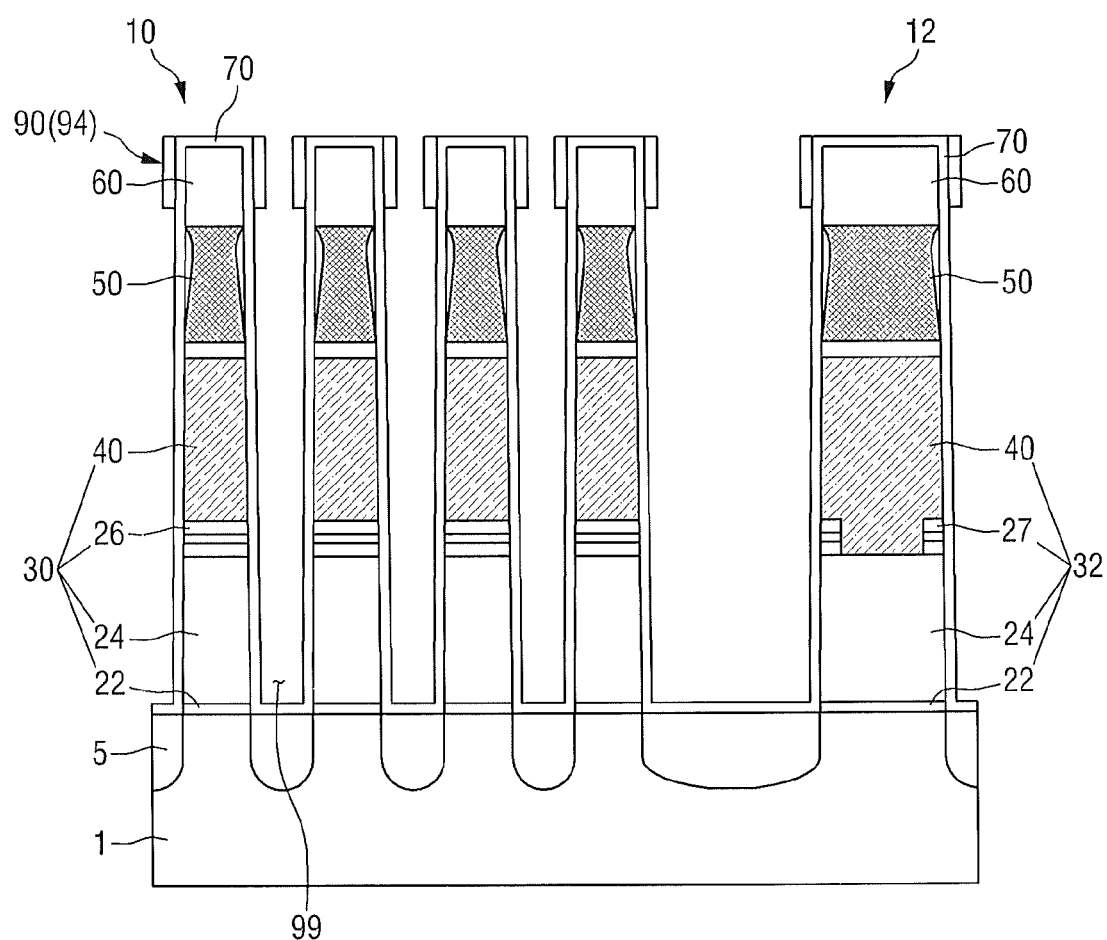
Figure 14:
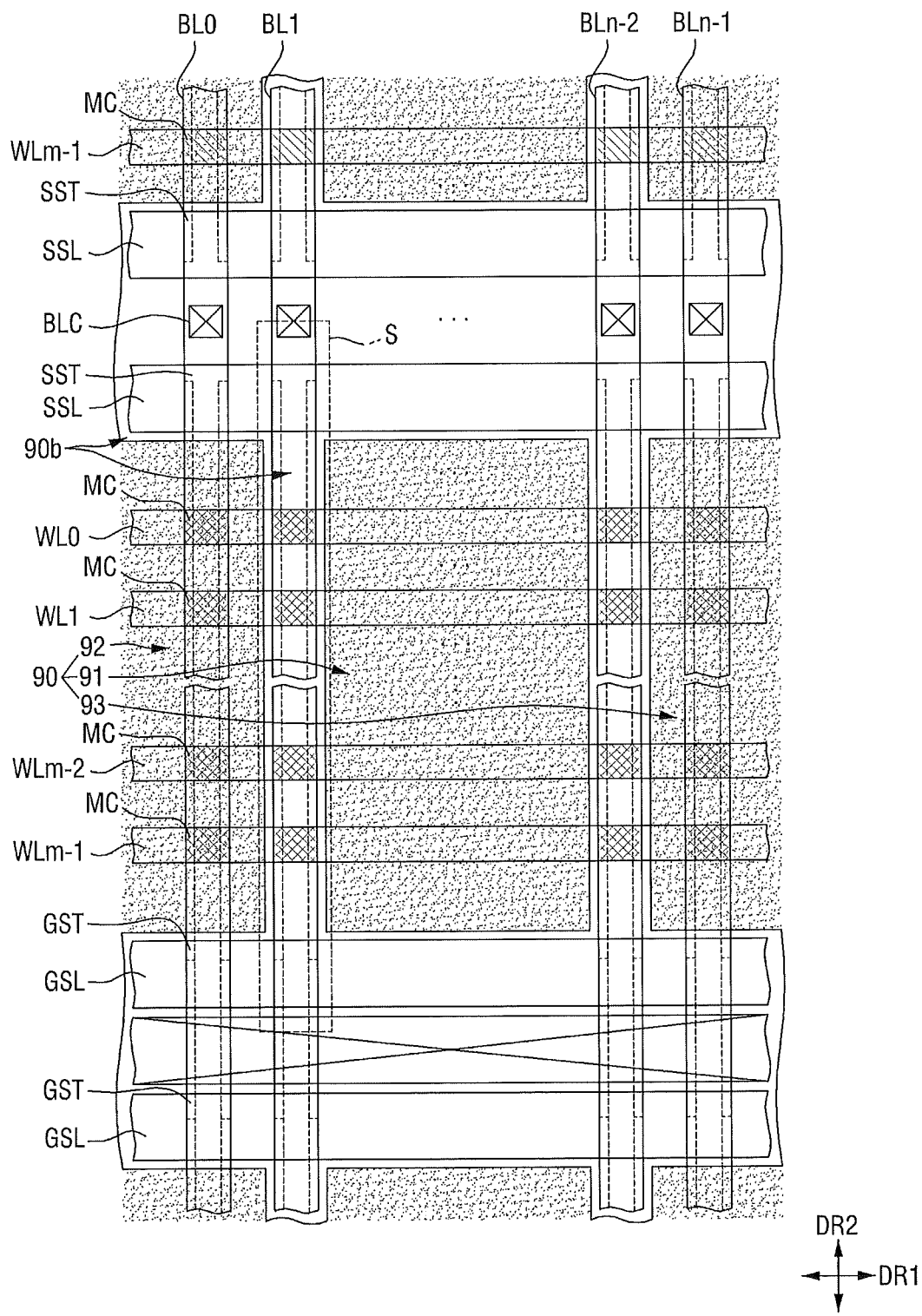
Figure 15:
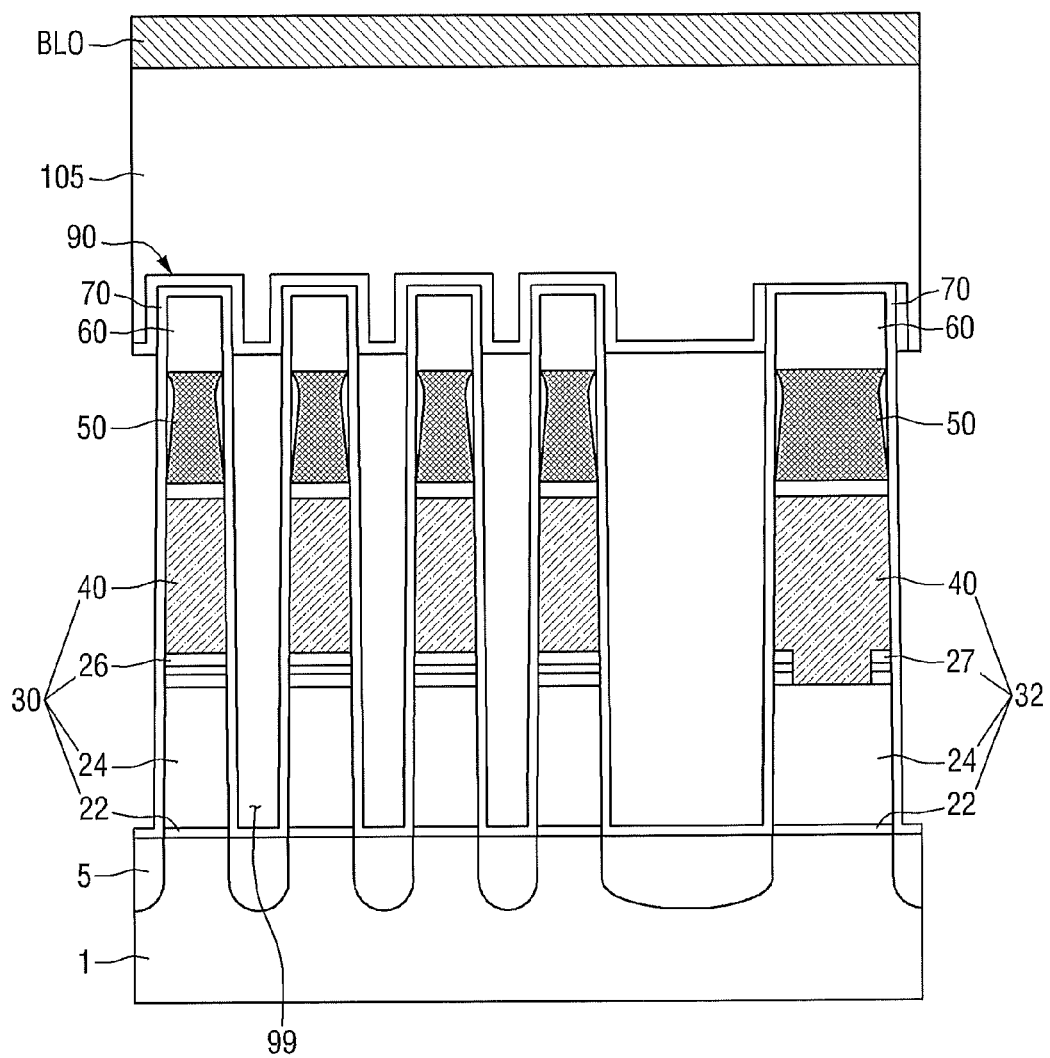

FIGS. 3 to 15 are diagrams illustrating intermediate steps of methods of fabricating a nonvolatile memory device according to embodiments of the present invention. Specifically, FIG. 3 is a schematic plan view of certain elements of the nonvolatile memory device. FIGS. 4-7 are cross-sectional views taken along the line A-A of FIG. 3 that illustrate certain of the steps of the fabrication methods according to embodiments of the present invention. FIG. 8 is a perspective view corresponding to the cross-sectional view of FIG. 7. FIG. 9 is a layout (plan) view of the nonvolatile memory device at an intermediate point during the fabrication process. FIG. 10 is a perspective view corresponding to the cross-sectional view of FIG. 9. FIG. 11 is a perspective view of the nonvolatile memory device at another intermediate point during the fabrication process. FIGS. 12 and 13 are cross-sectional views taken along the lines A-A and B-B of FIG. 11, respectively. FIG. 14 is a layout (plan) view of the nonvolatile memory device at another point during the fabrication process. Finally, FIG. 15 is a cross-sectional view taken along the line A-A of FIG. 14.

Figure 4:
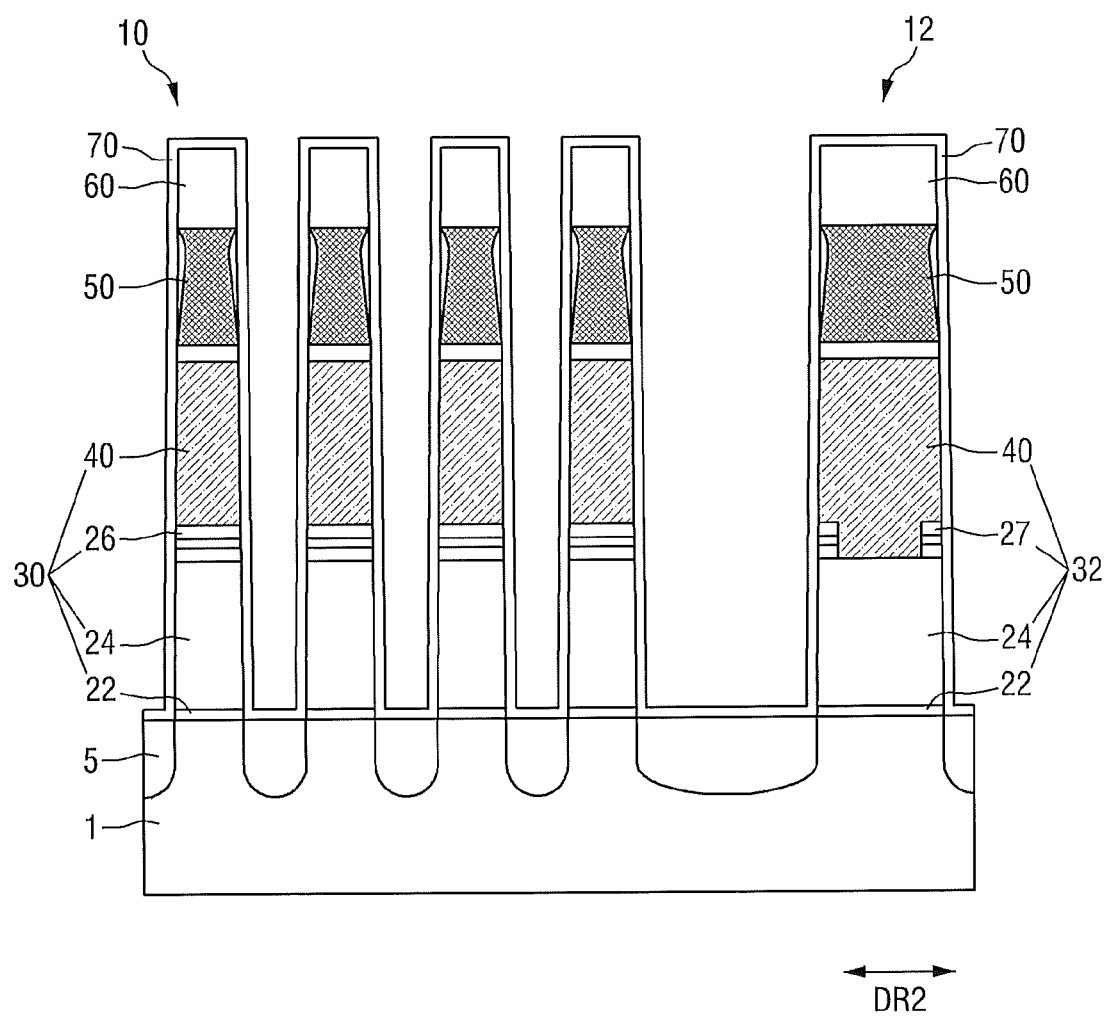

Referring to FIGS. 3 and 4, a plurality of gates 10 and 12 are formed on a substrate 1.

The plurality of gates 10 may correspond to the plurality of word lines (WL0~WLm-1) and may form the gates of the cell transistors (MC of FIG. 14). The gates 12 may correspond to the string select lines (SSL) or the ground select lines (GSL) and may form the gates of the string select transistor (SST of FIG. 14) and the gates of the ground select transistors (GST of FIG. 14).

The plurality of gates 10 and 12 are positioned adjacent each other and may extend in a first direction (DR1) along the substrate 1. As shown in FIGS. 3 and 4, a pitch between adjacent ones of the gates 10 (i.e., the distance between adjacent gates) may be different from a pitch between the end ones of the gates 10 that are adjacent to the gates 12. For example, the pitch between the adjacent ones of the gates 10 may be smaller than the pitch between the gates 10 and 12 that are adjacent to each other.

The gates 10 may include sequentially stacked lower structures 30, a metal gate pattern 50 and a mask pattern 60. The gates 12 may include sequentially stacked lower structures 32, a metal gate pattern 50 and a mask pattern 60.

In detail, the lower structure 30 of the gate 10 has a sequentially stacked structure including a first dielectric film 22, a charge storage film pattern 24, a second dielectric film 26 and a conductive pattern 40. The charge storage film pattern 24 and the conductive pattern 40 are electrically insulated from each other by the second dielectric film 26.

The first dielectric film 22 of the lower structure 30 may be a single layer or a composite film formed using a material suitable for electron tunneling such as, for example, $SiO_2$, $Hf_xO_y$, $Al_xO_y$, $Zr_xO_y$, $Ta_xO_y$, $Hf_xSi_{1-x}O_y$, or $Hf_xSi_{1-x}O_yN_z$, but is not limited thereto. The first dielectric film 22 may have a thickness of, for example, approximately 30 to 100 Angstroms.

The charge storage film pattern 24 of the lower structure 30 may be configured to store electrons which tunnel through the first dielectric film 22. In cases where the nonvolatile semiconductor integrated circuit has a floating gate structure, the charge storage film pattern 24 may be made of doped polysilicon. On the other hand, in cases where the nonvolatile semiconductor integrated circuit has a floating trap structure, such as a metal oxide nitride oxide semiconductor (MONOS) or a silicon oxide nitride oxide semiconductor (SONOS), the charge storage film pattern 24 may be made of a material that is capable of trapping electrons such as, for example, SiN.

The second dielectric film 26 of the lower structure 30 is an inter-gate dielectric layer that may be configured to reduce or prevent charges stored in the charge storage film pattern 24 from moving to the conductive pattern 40 or to a damascene metal film pattern 50. The second dielectric film 26 may be a single film or a composite film formed using at least one of, for example, ONO, $SiO_2$, $Hf_xO_y$, $Al_xO_y$, $Zr_xO_y$, $Ta_xO_y$, $Hf_xSi_{1-x}O_y$, and $Hf_xSi_{1-x}O_yN_z$, but is not limited thereto. The second dielectric film 26 may have a thickness of approximately 50 to 150 Angstroms.

The conductive pattern 40 of the lower structure 30 may be made of, for example, doped polysilicon. The metal gate pattern 50 may be made of W, Al, Cu, Pt and combinations thereof, and the mask pattern 60 may be made of SiN, but not limited thereto.

Turning to the gate 12, as shown in FIG. 4, the second dielectric film 27 of the lower structure 32 may be partially removed or, in other embodiments (not shown), removed in its entirety. As a result, the charge storage film pattern 24 and the conductive pattern 40 may be electrically connected to each other. Materials and thicknesses of the first dielectric film 22, the charge storage film pattern 24, the second dielectric film 27 and the conductive pattern 40 of the lower structure 32 of the gate 12 may be the same as those of the gates 10. In addition, materials of the metal gate pattern 50 and the mask pattern 60 of the gate 12 may be the same as those of the gates 10.

As shown in FIG. 4, a capping film 70 may be conformally formed along top surfaces and sidewalls of the gates 10 and 12 and a top surface of the substrate 1. The capping film 70 may be made of $SiO_2$, but is not limited thereto.

In addition, junction areas 5 that serve as source/drain regions are formed in the substrate 1. As shown, the junction areas 5 may be shared by adjacent transistors.

The substrate 1 may be made of at least one semiconductor material selected from the group consisting of Si, Ge, SiGe, GaP, GaAs, SiC, SiGeC, InAs, and InP, but is not limited thereto. In addition, the substrate 1 may be an SOI substrate. A plurality of wells (not shown) may be formed in the substrate 1 to improve or optimize transistor characteristics.

Figure 5:
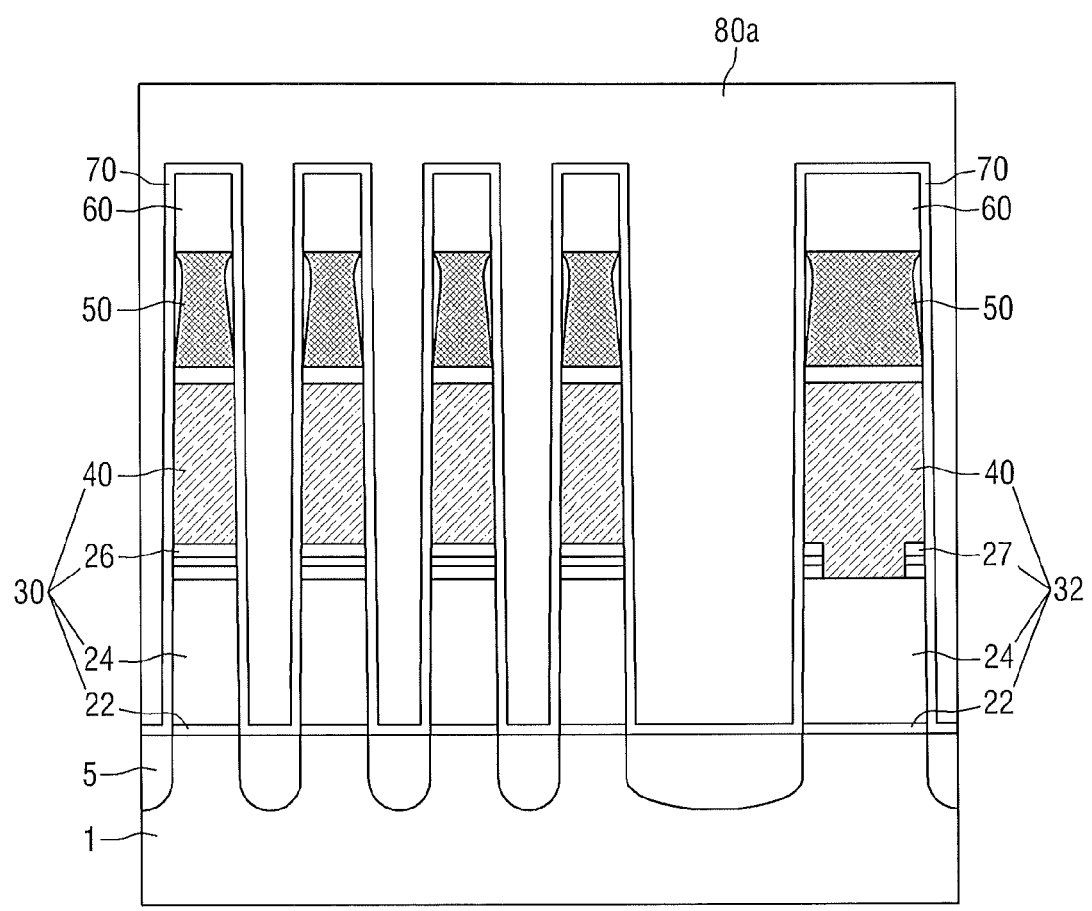
Figure 6:
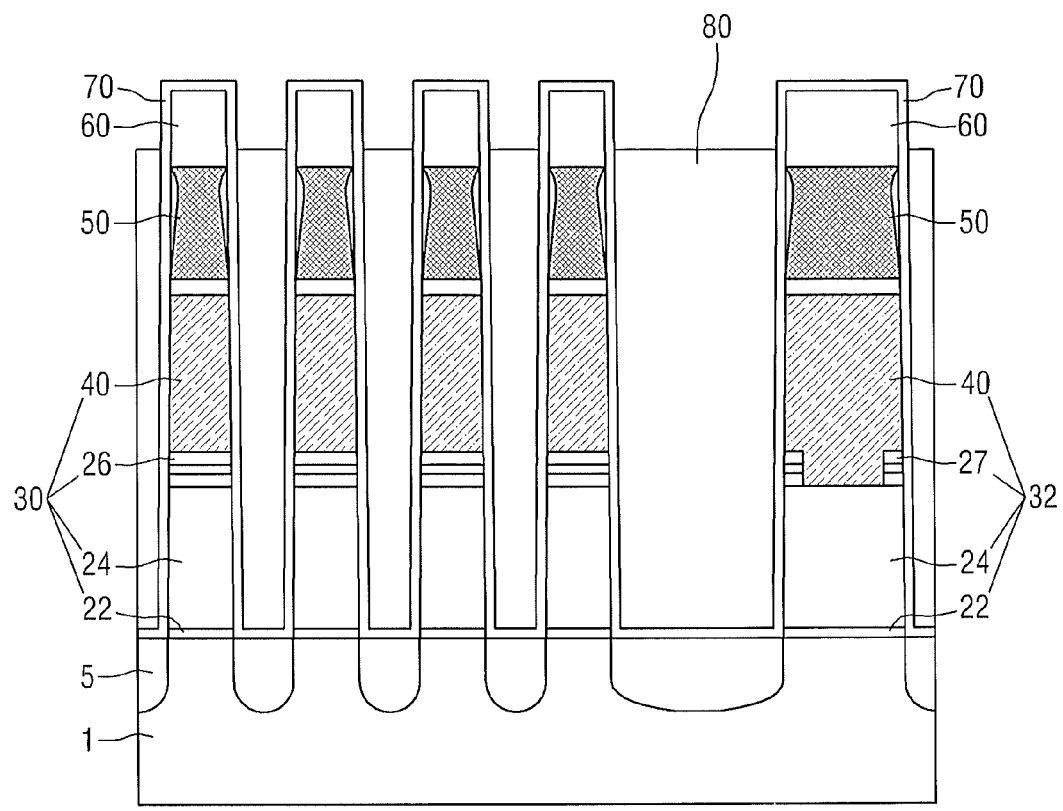

Referring to FIGS. 5 and 6, a gap-fill layer 80a may be formed in at least a portion of the space between the plurality of gates 10.

In detail, as shown in FIG. 5, the gap-fill layer 80a is formed to sufficiently cover the space between the plurality of gates 10 and top surfaces of the plurality of gates 10. The gap-fill layer 80a may be made of any material having a good gap-filling property to fill the space between the plurality of gates 10. For example, the gap-fill layer 80a may comprise a spin on hardmask (SOH) or a photoresist (PR), but is not limited thereto. If the gap-fill layer 80a is SOH, the SOH may be coated on the substrate 1 having the plurality of gates 10 and baked at a temperature ranging from, for example, 0 to 400° C. Depending upon the particular materials used, if the baking is performed at a temperature exceeding 400° C., stress may be applied to the plurality of gates 10. Accordingly, in some embodiments, the baking is performed at a temperature of 400° C. or less.

Thereafter, as shown in FIG. 6, the gap-fill layer 80a may be etched to reduce a height of the gap-fill layer 80a above the substrate 1. After the etching process is completed, the completed gap-fill layer 80 may still be higher above the substrate than the stacked lower structure 30 and the metal gate pattern 50. The completed gap-fill layer 80 may partially expose the mask pattern 60. Thus, the completed gap-fill layer 80 may fill the space between the lower structures 30/32 and metal gate patterns 50 of adjacent gates 10 and 12, but aspects of the present invention are not limited thereto. The completed gap-fill layer 80 may minimize oxidation of the metal gate pattern 50 in a subsequent process by protecting the metal gate pattern 50. However, the height of the completed gap-fill layer 80 may be varied from what is shown in FIG. 6 for a variety of reasons including, for example, the fabrication process used.

Figure 7:
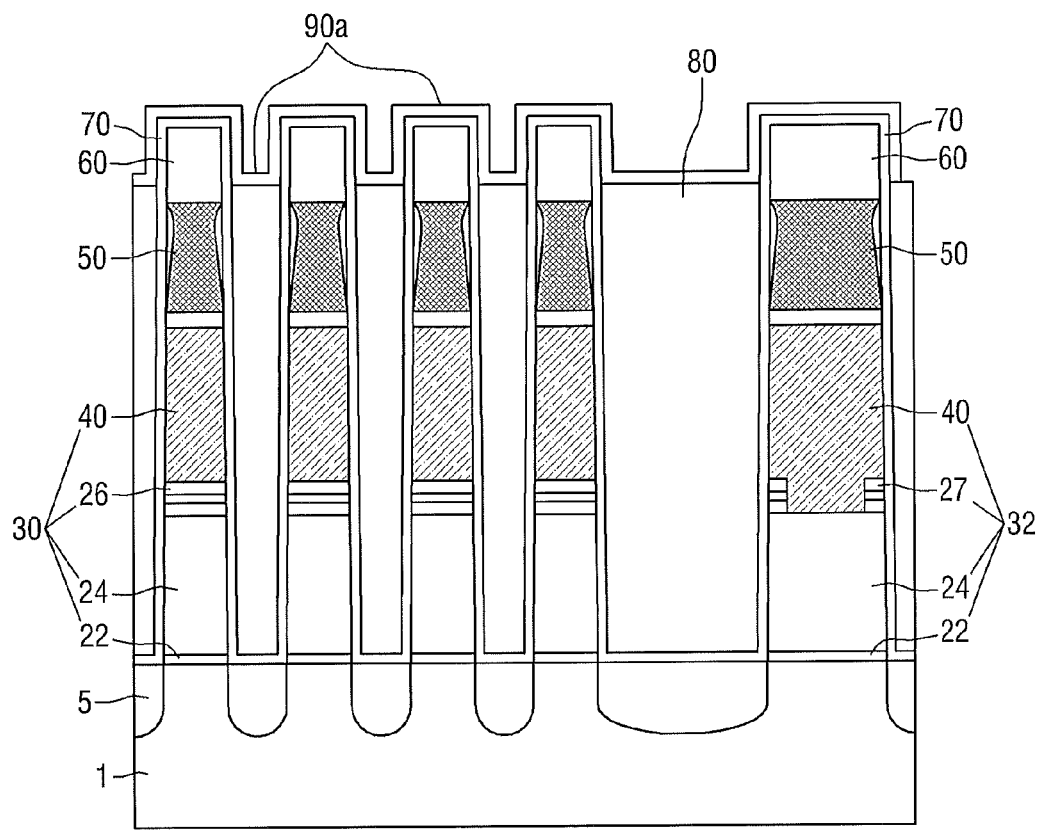
Figure 8:
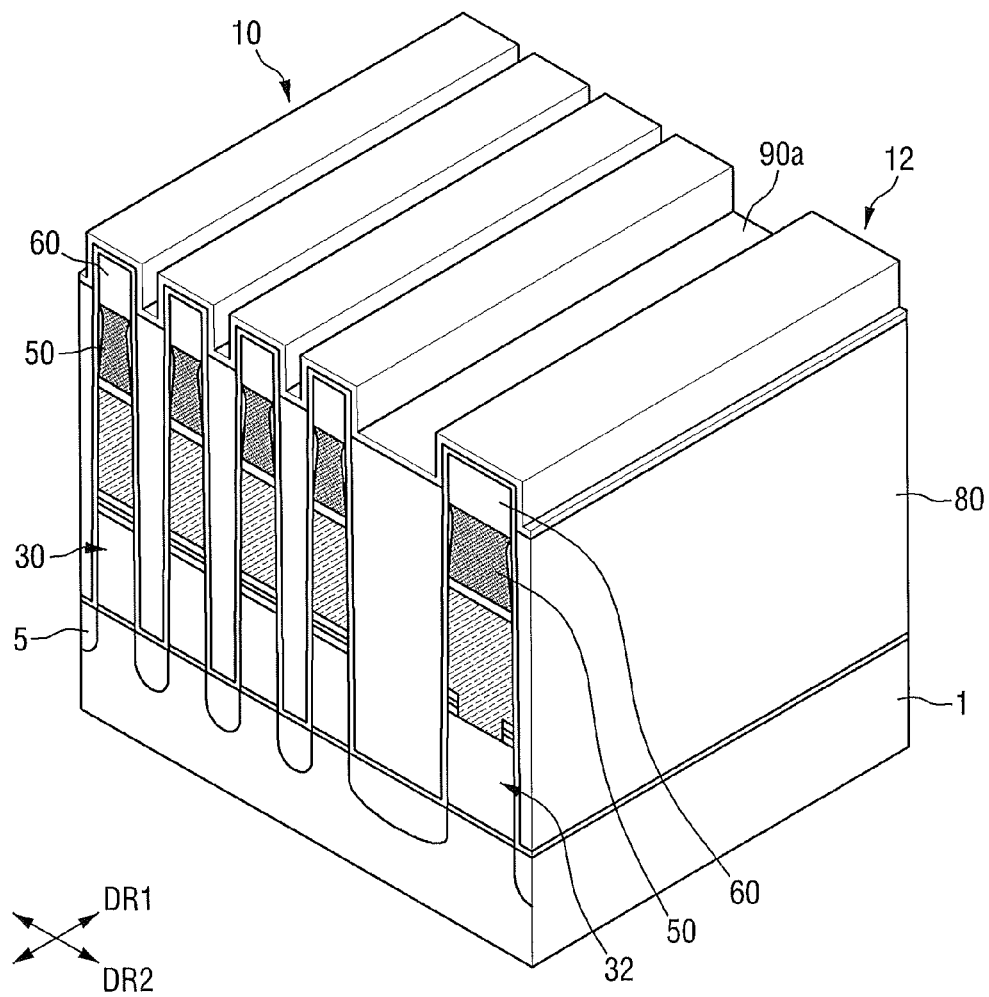

Referring to FIGS. 7 and 8, a supporter layer 90a may be formed on the gates 10 and the gap-fill layer 80.

In some embodiments, the supporter layer 90a may be conformally formed on top surfaces and the portions of the sidewalls of the gates 10 that are exposed by the gap-fill layer 80 and on the top surface of the gap-fill layer 80.

The supporter layer 90a may be made of, for example, SiN or $SiO_2$, but is not limited thereto. The supporter layer 90a may be formed by, for example, atomic layer deposition (ALD). The use of an ALD process may reduce or prevent stress from being applied to the gates 10 and 12 during the formation of the supporter layer 90a since the ALD process may be performed at, for example, room temperature. However, other methods of forming the supporter layer 90a may be used.

Referring to FIGS. 9 and 10, a photoresist pattern (not shown) is formed on the supporter layer 90a. The supporter layer (90a of FIGS. 7 and 8) is patterned using the photoresist pattern, thereby forming the supporter pattern 90. The photoresist pattern may include one more line patterns extending in a second direction (DR2) that is different from the first direction (DR1). For example, the second direction (DR2) may be perpendicular to the first direction (DR1).

The supporter pattern 90 may be configured to support the plurality of gates 10 so as to reduce or prevent the probability that the gates 10 collapse (or lean onto each other). The supporter pattern 90 may have any shape as long as it is capable of performing this function.

For example, as shown in FIGS. 9 and 10, the supporter pattern 90 may include one or more first lines 91, 92 and 93 that extend across the plurality of gates 10 in the second direction (DR2). The second direction (DR2) may be perpendicular to the first direction (DR1), but aspects of the present invention are not limited thereto. Since the supporter pattern 90 is formed to intersect the plurality of gates 10, it may support the plurality of gates 10 so as to reduce the possibility that the gates 10 do not lean, collapse or fall down.

In addition, the supporter pattern 90 may include a plurality of second line patterns 94 extending along sidewalls of the plurality of gates 10 in the first direction (DR1) (see FIG. 10). If the supporter pattern 90 is formed by dry etching the supporter layer (90a of FIGS. 7 and 8), the supporter layer 90a formed on the sidewalls of the plurality of gates 10 may remain, thereby forming the second line patterns 94 along the sidewalls of the plurality of gates 10.

In addition, the supporter pattern 90 may include one or more openings 90b. The gap-fill layer 80 can be removed using the openings 90b, which will later be described.

As is also shown in FIGS. 9 and 10, the supporter pattern 90 may not be formed on at least the top surface of the gate 12 (i.e., the supporter pattern 90 is not formed on the top surfaces of the string select line and the ground select line). Since a pitch between the gate 12 (specifically on the string select line or the ground select line) and its adjacent gate is relatively large, the supporter pattern 90 may not be necessary.

In addition, although not shown in FIGS. 9 and 10, the supporter pattern 90 may not be formed on the peripheral circuit region (PERI of FIG. 1). Since a pitch between an element formed on the peripheral circuit region (PERI of FIG. 1) and its adjacent element is relatively large, the supporter pattern 90 may not be necessary in this region either.

FIG. 11 is a perspective view of the nonvolatile memory device at an intermediate point during the fabrication process. FIGS. 12 and 13 are cross-sectional views taken along the lines A-A and B-B of FIG. 11, respectively.

Referring to FIGS. 11, 12 and 13, an air gap 99 is formed in the spaces between the gates 10 by removing the gap-fill layer 80. The air gap 99 may be formed using, for example, an ashing process or a stripping process. Herein, the term "ashing or stripping process" may encompass an ashing process only, a stripping process only and both ashing and stripping processes. The gap-fill layer 80 may be removed using the one or more openings 90b formed in the supporter pattern 90.

Processing conditions of the ashing or stripping process may be determined in consideration of, for example, the depth of the gap-fill layer 80 and the amount of the gap-fill layer 80 that is to be removed. For example, the power used in the ashing process may range from about 1000 W to about 5000 W, and the gas (e.g., $O_2$) may be used in an amount of about 2000 sccm to about 10000 sccm. The stripping process may employ, for example, DSP, HF or HS.

As shown in FIG. 12, the cross sectional shape of the supporter pattern 90 along the line A-A of FIG. 11 (i.e., the first line pattern 92 of supporter pattern 90) may include first patterns 97 that are conformally formed on top surfaces and sidewalls of the plurality of gates 10 and second patterns 98 that connect adjacent first patterns 97 to each other.

As shown in FIG. 13, the cross sectional shape of supporter pattern 90 taken along the line B-B of FIG. 11 may simply comprise the second line patterns 94 that are formed on the sidewalls of the gates 10.

Referring to FIGS. 14 and 15, after forming the air gap 99, an interlayer dielectric film 105 may be formed on the plurality of gates 10 and on the supporter pattern 90. The interlayer dielectric film 105 may be, for example, PE-TEOS. The interlayer dielectric film 105 may be scarcely formed in the air gap 99 due to presence of the supporter pattern 90. That is to say, the size of the air gap 99 is not substantially reduced by the interlayer dielectric film 105. Next, bit line contacts (BLC) and bit lines BL0~BLn-1 are sequentially formed. The bit lines BL0~BLn-1 may be formed to extend in the second direction DR2.

In the fabricating method of the nonvolatile memory device according to embodiments of the present invention, since the supporter pattern 90 supports the plurality of gates 10 to reduce or prevent any tendency for the gates 10 to lean or collapse, failures can be remarkably reduced.

In addition, since the interlayer dielectric film 105 is formed on the supporter pattern 90, the size of the air gap 99 may not be reduced by the interlayer dielectric film 105. In addition, the supporter pattern 90 can help reduce any tendency of the interlayer dielectric film 105 to apply stress to the gate patterns 10 and 12.

Figure 16:
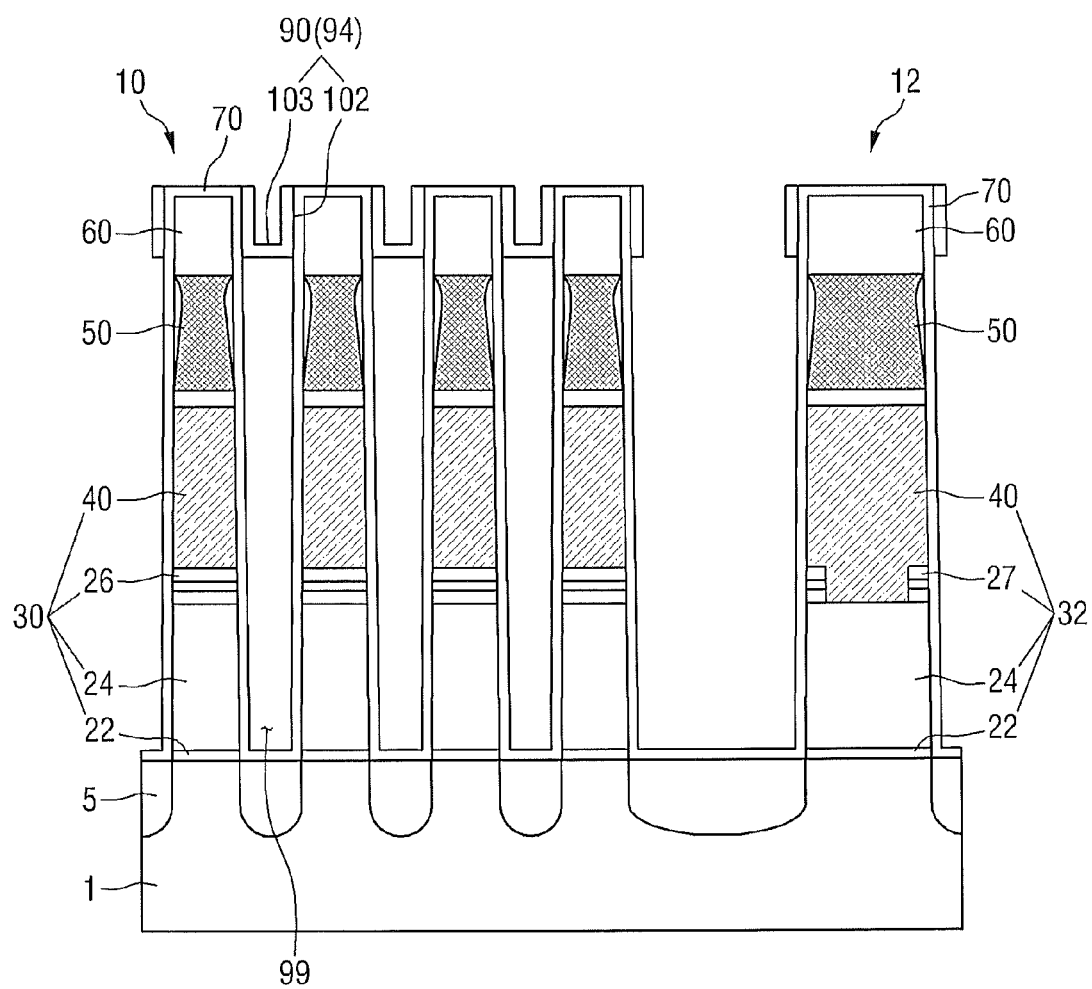
FIG. 16 is a cross-sectional view illustrating intermediate steps for fabricating a nonvolatile memory device according to further embodiments of the present invention.

FIG. 16 is a cross-sectional view taken along the line B-B of FIG. 11 that illustrates intermediate steps of a method of fabricating a nonvolatile memory device according to another embodiment of the present invention.

As shown in FIG. 16, the shape of the supporter pattern 90 may be varied based on, for example, the etching conditions applied. By way of example, the supporter pattern 90 shown in FIG. 13 is positioned only on the sidewalls of the plurality of gates 10. However, as shown in FIG. 16, in other embodiments the supporter pattern 90 may instead comprise third patterns 102 that are formed on the sidewalls of the plurality of gates 10 and fourth patterns 103 that connect adjacent third patterns 102 to each other. Even when the supporter pattern 90 includes the fourth pattern 103, the gap-fill layer 80 can be removed just by adjusting processing conditions of the ashing or stripping process.

For example, when the supporter pattern 90 has the shape shown in FIG. 13, the power used in the ashing process may be about 2000 W and the gas ($O_2$) used may be in an amount of about 2000 sccm. When the supporter pattern 90 has the shape shown in FIG. 16, the power used in the ashing process may be increased to about 4800 W and the gas ($O_2$) used may be increased to about 10000 sccm.

When the supporter pattern 90 has a shape shown in FIG. 13, DSP or HF may be used in the stripping process. When the supporter pattern 90 has a shape shown in FIG. 16, HS may be used in the stripping process.

Figure 17:
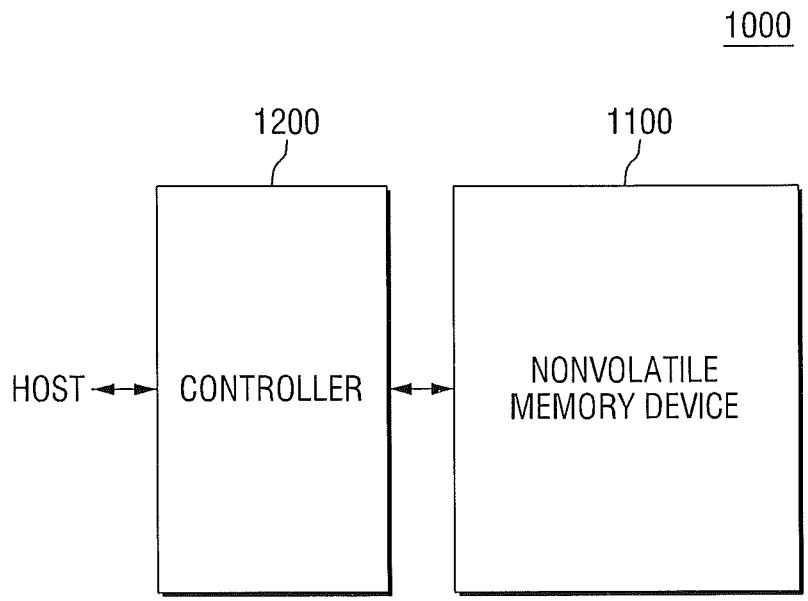
FIG. 17 is a block diagram of a memory system according to some embodiments of the present invention.

FIG. 17 is a block diagram of a memory system according to some embodiments of the present invention.

Referring to FIG. 17, the memory system 1000 includes a nonvolatile memory device 1100 and a controller 1200.

The nonvolatile memory device 1100 may be fabricated by any of the methods described above with reference to FIGS. 1 to 16.

The controller 1200 is connected to a host and to the nonvolatile memory device 1100. In response to a request from the host, the controller 1200 is configured to access the nonvolatile memory device 1100. For example, the controller 1200 is configured to control read, write, erase and background operations of the nonvolatile memory device 1100. The controller 1200 provides interfacing between the nonvolatile memory device 1100 and the host. The controller 1200 may be configured to drive firmware for controlling the nonvolatile memory device 1100.

In an example embodiment, the controller 1200 may further include well-known constituent elements such as RAM, a processing unit, a host interface, and a memory interface. The RAM may be used as one of a working memory of the processing unit, a cache memory between the nonvolatile memory device 1100 and the host, and/or a buffer memory between the nonvolatile memory device 1100 and the host. The processing unit may control an overall operation of the controller 1200.

The host interface may include a protocol to exchange data between the host and the controller 1200. For example, the controller 1200 can be configured to communicate with the external host using interface protocols such as universal serial bus (USB) protocol, multimedia card (MMC) protocol, peripheral component interconnection (PCI) protocol, PCI-express (PCI-E) protocol, advance technology attachment (ATA) protocol, serial-ATA protocol, parallel-ATA protocol, small computer system interface (SCSI) protocol, enhanced small disk interface (ESDI) protocol, and integrated drive electronics (IDE) protocol.

The memory interface may interface with the nonvolatile memory device 1100. For example, the memory interface may include a NAND interface or a NOR interface.

The memory system 1000 may further comprise an error correction code (ECC) block. The ECC block is configured to detect and correct errors within data read from nonvolatile memory device 1100 using an error correction code (ECC). In an example embodiment, the ECC block is provided as a constituent element of the controller 1200. The ECC block may be provided as a constituent element of the nonvolatile memory device 1100.

The controller 1200 and the nonvolatile memory device 1100 may be integrated to form one semiconductor device such as a memory card. For example, the controller 1200 and the nonvolatile memory device 1100 may be integrated to form a personal computer memory card international association (PCMCIA) card, a compact flash (CF) card, a smart media (SM) card, a memory stick, a multi-media card (MMC), a reduced-size multimedia card (RS-MMC), an MMCmicro card, a secure digital (SD) card, a miniSD card, a microSD card, a SDHC card, or a universal flash storage (UFS) card, or the like.

The controller 1200 and the nonvolatile memory device 1100 may be integrated to form a solid state drive/disk (SSD). The SSD includes a storage device configured to store data in a semiconductor memory. Where the memory system 1000 is used as the SSD, an operating speed of a host device connected with the memory system 1000 may be improved remarkably.

In another example embodiment, the memory system 1000 may be applied to one of a computer, a ultra mobile PC (UMPC), a workstation, a net-book, a personal digital assistant (PDA), a portable computer, a web tablet, a wireless phone, a mobile phone, a smart phone, e-book, a portable multimedia player (PMP), a portable game device, a navigation device, a black box, a digital camera, a 3-dimensional television, a digital audio recorder/player, a digital picture recorder/player, a digital video player, a device capable of transmitting/receiving data in a wireless environment and various electronic devices constituting a home network, one of various electronic devices constituting a computer network, one of various electronic devices constituting a telematics network, an RFID device, or one of various constituents elements of a computing system.

In an example embodiment, the nonvolatile memory device 1100 and/or the memory system 1000 can be mounted together in various types of packages. For example, the nonvolatile memory device 1100 and/or the memory system 1000 can be mounted in a package having a configuration such as package on package (PoP), ball grid array (BGA), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi chip package (MCP), wafer-level fabricated package (WFP), wafer-level processed stack package (WSP), etc.

Figure 18:
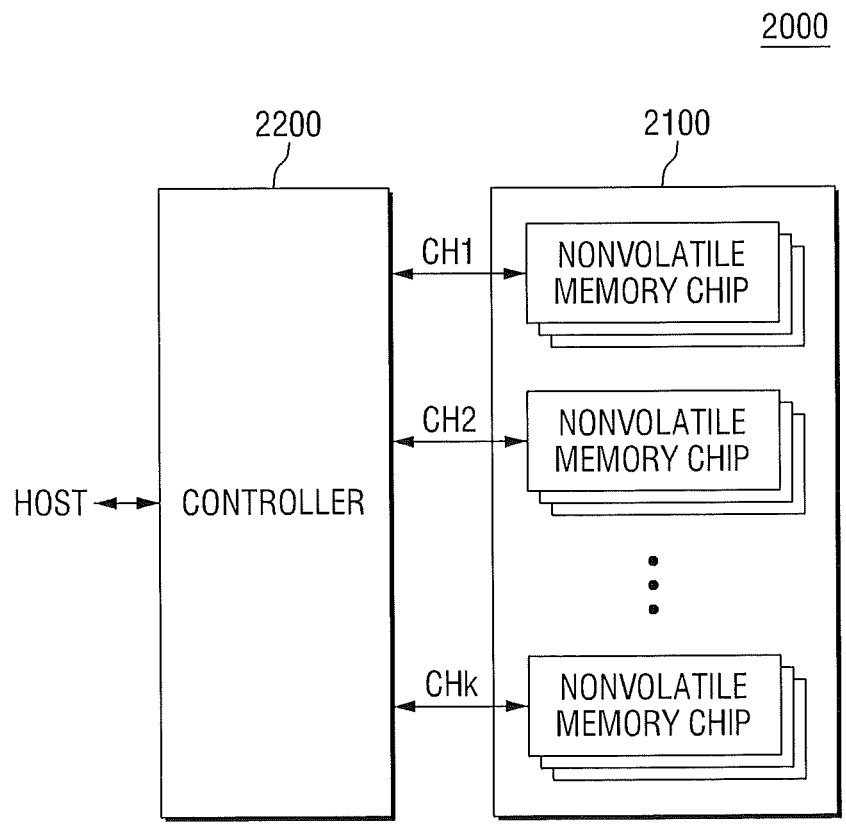
FIG. 18 is a block diagram illustrating an application example of a memory system of FIG. 17.

FIG. 18 is a block diagram illustrating an application example of a memory system of FIG. 17.

Referring to FIG. 18, the memory system 2000 comprises a nonvolatile memory device 2100 and a controller 2200. The nonvolatile memory device 2100 includes a plurality of nonvolatile memory chips. The plurality of nonvolatile memory chips are divided into a plurality of groups. Each group of the plurality of nonvolatile memory chips may be configured to communicate with the controller 2200 through a common channel. For example, the plurality of nonvolatile memory chips may communicate with the controller 2200 through first to kth channels CH1~CHk.

Each of the plurality of nonvolatile memory chips may be a nonvolatile memory device fabricated by the methods described above with reference to FIGS. 1 to 16.

FIG. 18 illustrates that a plurality of nonvolatile memory chips are connected to one channel. However, it will be appreciated that the memory system 2000 may be modified such that one nonvolatile memory chip is connected to one channel.

Figure 19:
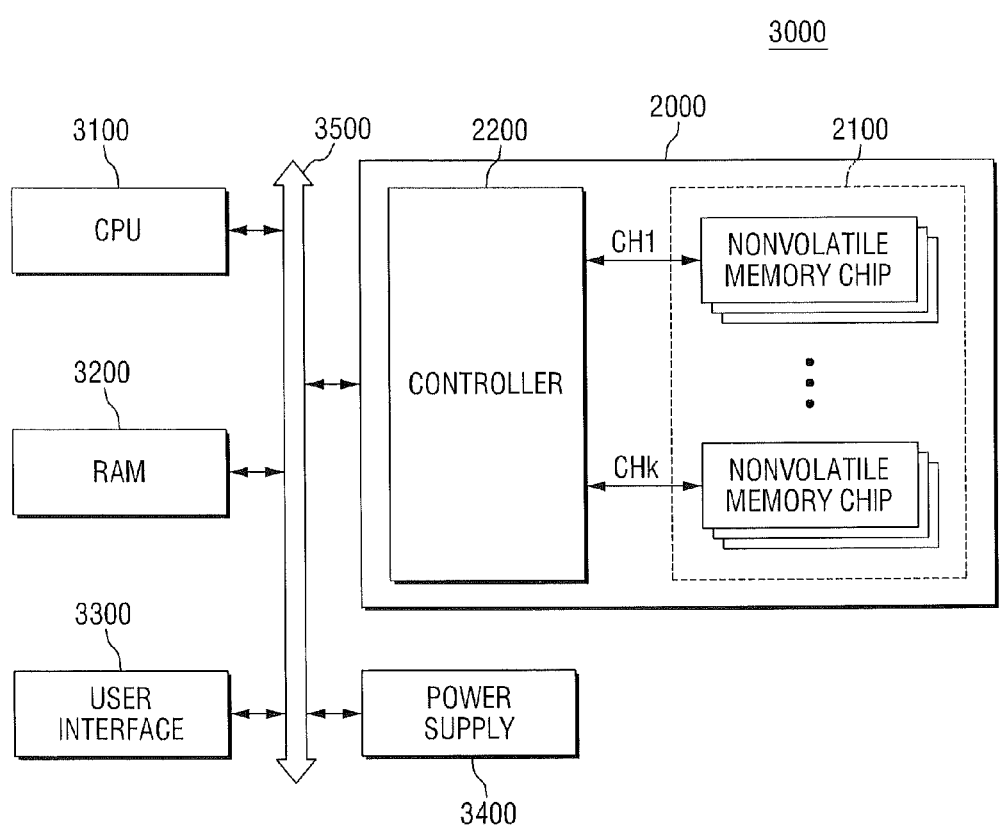
FIG. 19 is a block diagram illustrating an example of a computing system that incorporates the nonvolatile memory system of FIG. 18.

FIG. 19 is a block diagram illustrating an example of a computing system 3000 incorporating the nonvolatile memory system of FIG. 18.

Referring to FIG. 19, the computing system 3000 comprises a central processing unit (CPU) 3100, a random access memory (RAM) 3200, a user interface 3300, a power supply 3400 and a memory system 2000.

The memory system 2000 is electrically connected to the central processing unit 3100, the RAM 3200, the user interface 3300 and the power supply 3400 through a system bus 3500. The data provided through the user interface 3300 or processed by the central processing unit 3100 may be stored in the memory system 2000.

FIG. 19 illustrates that the nonvolatile memory device 2100 is connected to the system bus 3500 through the controller 2200. However, the nonvolatile memory device 2100 may be configured to be directly connected to the system bus 3500.

FIG. 19 illustrates the memory system 2000 shown in FIG. 18 is provided in the nonvolatile memory device 2100. However, the memory system 2000 may be substituted by the memory system 1000 shown in FIG. 17.

In an example embodiment, the computing system 3000 may be configured to include both the memory systems 1000 and 2000 shown in FIGS. 17 and 18.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a nonvolatile memory, the method comprising:
   forming a plurality of gates that extend in a first direction on a substrate to be adjacent each other;
   forming a gap-fill layer filling at least a portion of spaces that are provided between the plurality of gates;
   forming a supporter pattern that is configured to support at least some of the plurality of gates on at least some of the plurality of gates and the gap-fill layer, the supporter pattern exposing a part of a top surface of the gap-fill layer; and
   forming an air gap in the spaces between the plurality of gates by at least partially removing the gap-fill layer,
   wherein the substrate includes a cell array region and a peripheral circuit region, the forming of the plurality of gates on the substrate comprises forming the plurality of gates on the cell array region of the substrate, and the forming of the supporter pattern comprises forming the supporter pattern on a region other than the peripheral circuit region.

2. The method of claim 1, wherein the supporter pattern comprises at least one line pattern that extends across the plurality of gates in a second direction that is different from the first direction.

3. The method of claim 2, wherein the at least one line pattern includes first portions conformally formed along top surfaces and sidewalls of the plurality of gates and second portions that connect adjacent first portions.

4. The method of claim 1, wherein the supporter pattern includes a plurality of second line patterns that extend in the first direction along the sidewalls of the plurality of gates.

5. The method of claim 1, wherein the supporter pattern has one or more openings.

6. The method of claim 1, wherein the gap-fill layer comprises a spin on hardmask (SOH) or a photoresist (PR).

7. The method of claim 1, wherein the forming of the air gap comprises forming the air gap using an ashing process or a stripping process.

8. The method of claim 1, wherein each of the gates includes a lower structure, a metal gate pattern and a mask pattern that are sequentially stacked.

9. The method of claim 8, wherein the gap-fill layer covers sidewalls of the lower structure and the metal gate pattern and exposes a portion of the mask pattern.

10. The method of claim 1, wherein the forming of the supporter pattern comprises forming a supporter layer on the plurality of gates and the gap-fill layer, forming a photoresist pattern on the supporter layer, and forming a supporter pattern by patterning the supporter layer using the photoresist pattern.

11. The method of claim 1, wherein the forming of the plurality of gates on the substrate further comprises forming a string select gate extending on the substrate in the first direction to be adjacent to the plurality of gates and the forming of the supporter pattern comprises forming the supporter pattern on a region other than the string select gate.

12. The method of claim 1, wherein after forming the air gap, the method further comprises forming an interlayer dielectric film on the plurality of gates and the supporter pattern.

13. A method of fabricating a nonvolatile memory device, comprising:
   forming a plurality of gates that extend along a substrate in a first direction, wherein each of the gates includes a lower structure, a metal gate pattern and a mask pattern, which are sequentially stacked;
   forming a gap-fill layer in spaces between the plurality of gates, the gap-fill layer completely covering sidewalls of the lower structure and the metal gate pattern on each of the gates;
   forming a supporter layer on the plurality of gates and on the gap-fill layer;
   forming a photoresist pattern on the supporter layer, the photoresist pattern including one or more line patterns that extend in a second direction that is different from the first direction;
   forming a supporter pattern by using the photoresist pattern to pattern the supporter layer, the supporter pattern exposing a part of a top surface of the gap-fill layer; and
   forming air gaps between adjacent ones of the plurality of gates by removing the gap-fill layer
   wherein the supporter pattern comprises at least one line pattern that extends across the plurality of gates in a second direction that is different from the first direction, and
   wherein the at least one line pattern includes first portions conformally formed along top surfaces and sidewalls of the plurality of gates and second portions that connect adjacent first portions.

14. The method of claim 13, wherein the gap-fill layer comprises a spin on hardmask (SOH) or a photoresist (PR).

15. A method of fabricating a nonvolatile memory device, the method comprising:
   forming a plurality of gate lines that extend in a first direction on a substrate, wherein at least some of the gate lines include a tunnel dielectric film, a charge storage pattern, a dielectric pattern, a conductive pattern, a metal gate pattern and a mask pattern that are sequentially stacked on a top surface of the substrate; and
   forming a supporter pattern between at least some of the gate lines,
   wherein the supporter pattern includes first segments that are on upper portions of the sidewalls of the gate lines and second segments that connect the first segments that are on facing sidewalls of adjacent gate lines, and
   wherein the gate lines extend upwardly from a substrate, wherein the supporter pattern includes third segments that are on top surfaces of the gate lines, and wherein the third portions of the supporter pattern are at a first height above the substrate and the second portions of the supporter pattern are at a second height above the substrate that is less than the first height.

16. The method of claim 15, wherein air gaps are provided between adjacent ones of the gate lines.

17. The method of claim 15, wherein the first segments and the second segments of the supporter pattern form a continuous supporter pattern that extends across the plurality of gate lines in a second direction that is generally perpendicular to the first direction.

18. The method of claim 15, the method further comprising forming a gap-fill layer in spaces between the plurality of gate lines prior to forming the supporter pattern, wherein the first and second segments of the supporter pattern are formed directly on the gap-fill layer.

* * * * *